(12) United States Patent
Anegawa

(10) Patent No.: US 9,484,875 B2
(45) Date of Patent: Nov. 1, 2016

(54) ACTIVE ATTENUATOR KEEPING SATURATED OUTPUT POWER FOR REDUCED INPUT POWER

(71) Applicant: Sumitomo Electric Industries, Ltd., Osaka-shi (JP)

(72) Inventor: Osamu Anegawa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 273 days.

(21) Appl. No.: 14/262,379

(22) Filed: Apr. 25, 2014

(65) Prior Publication Data

US 2014/0320240 A1 Oct. 30, 2014

(30) Foreign Application Priority Data

Apr. 26, 2013 (JP) .................. 2013-094388

(51) Int. Cl.
*H01P 1/22* (2006.01)
*H03G 1/00* (2006.01)
*H03H 11/24* (2006.01)
*H03H 7/25* (2006.01)

(52) U.S. Cl.
CPC .............. *H03G 1/007* (2013.01); *H01P 1/22* (2013.01); *H03H 7/25* (2013.01); *H03H 11/24* (2013.01)

(58) Field of Classification Search
CPC .......... H03H 7/24; H03H 7/25; H03H 7/253; H03H 7/255; H03H 7/256; H03H 11/245; H03H 11/24; H01P 1/22
USPC ..................... 333/81 R, 81 A; 327/308, 309
See application file for complete search history.

(56) References Cited

U.S. PATENT DOCUMENTS 5,392,009 A * 2/1995 Talwar .................... H03C 1/14
                                                           333/109
6,853,691 B1 * 2/2005 Kim ..................... H04L 27/368
                                                           375/308

FOREIGN PATENT DOCUMENTS

JP          11-274870         10/1999

* cited by examiner

*Primary Examiner* — Stephen E Jones
(74) *Attorney, Agent, or Firm* — Venable LLP; Michael A. Sartori; Laura G. Remus

(57) ABSTRACT

An active attenuator is disclosed. The attenuator includes a divider to divide an input signal into two signals, a phase shifter to shift a phase of one of output signals of the divider, and a combiner to combine an output of the phase shifter with another of output signals of the divider. The phase shifter includes a coupler and two reflectors, or two amplifiers to cause a phase difference between two signals.

6 Claims, 12 Drawing Sheets

Fig. 2A
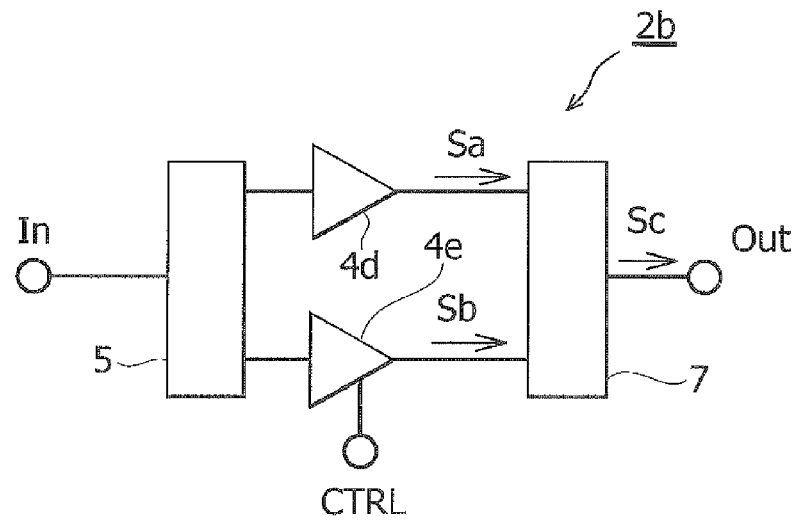
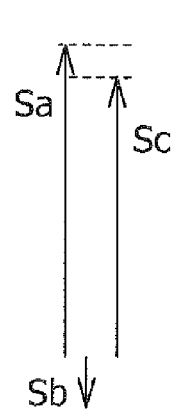
Sa > Sb
Fig. 2B
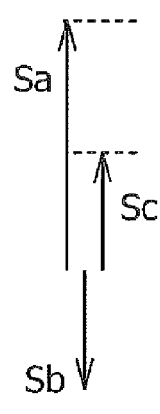
Sb = Sa/2
Fig. 2C
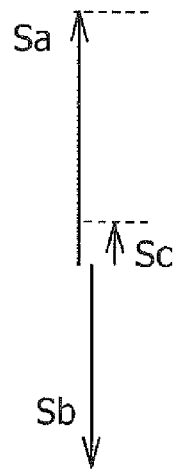
Sa ~ Sb
Fig. 2D Fig. 3A
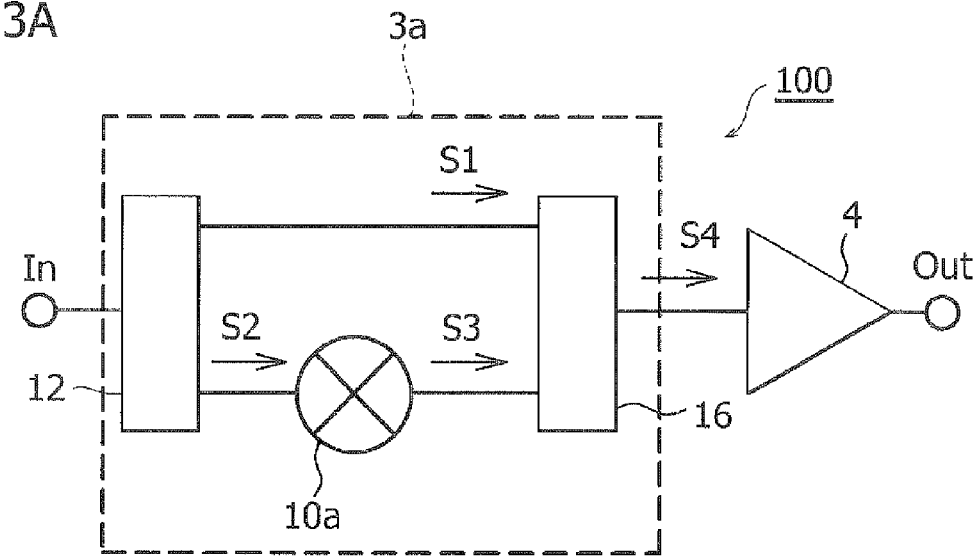
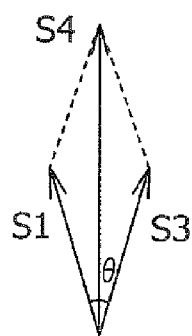
θ=20°
Fig. 3B
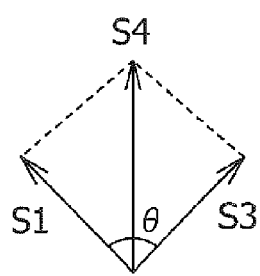
θ=90°
Fig. 3C
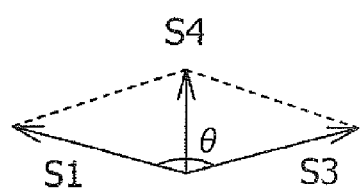
θ=160°
Fig. 3D

S9 = S10

S9 > S10

S9 < S10

US 9,484,875 B2

ACTIVE ATTENUATOR KEEPING SATURATED OUTPUT POWER FOR REDUCED INPUT POWER

TECHNICAL FIELD

The present application relates to an attenuator and a circuit implementing the attenuator.

BACKGROUND

It is commonly requested to keep an output level of an amplifier in constant. An automatic level control (hereafter denoted as ALC) is used to implement with such a function to detect an output level of an amplifier and to keep the output level in constant. One type of the ALC sometimes implements with an attenuator to adjust an input level of the amplifier. A Japanese Patent Application Laid-Open Publication No. JP-H11-274870 has disclosed a system providing attenuators and amplifiers connected to the attenuators.

However, conventional techniques sometimes fail to realize a normal ALC. For instance, when a huge level is input to an amplifier, the ALC adjusts a gain of the amplifier to keep the output level thereof. Under such a condition, the output level of the amplifier saturates in smaller level, which makes hard to detect the output level securely. Thus, both the input and output levels of an amplifier are necessary to be controlled in respective adequate levels.

SUMMARY

An aspect of the present application relates to an attenuator that includes a divider, a phase shifter, and a combiner. The divider divides an input single into first and second signals. The phase shifter shifts a phase of the second signal to generate the third signal. The combiner combines the first signal with the third signal to generate the forth signal. According to the attenuator of embodiments of the present application, depending on the phase difference between the first and second signals, the fourth signal in the amplitude thereof may be varied.

BRIEF DESCRIPTION OF THE DRAWINGS

A more complete appreciation of aforementioned and other features, aspects, and advantages will be better understood by reference to the following detailed description when considered in connection with the accompanying drawings, wherein:

FIG. 2A is a functional block diagram of a circuit with a type of an opposite phase combiner having a variable gain amplifier (VGA); and FIGS. 2B to 2D schematically show mechanisms to combine two signals each having phases opposite to the others;

FIG. 3A is a functional block diagram of a circuit implemented with an attenuator according to the first embodiment of the present application; and FIGS. 3B to 3D show mechanism to generate a vector sum of two signals;

DETAILED DESCRIPTION

Figure 1A:
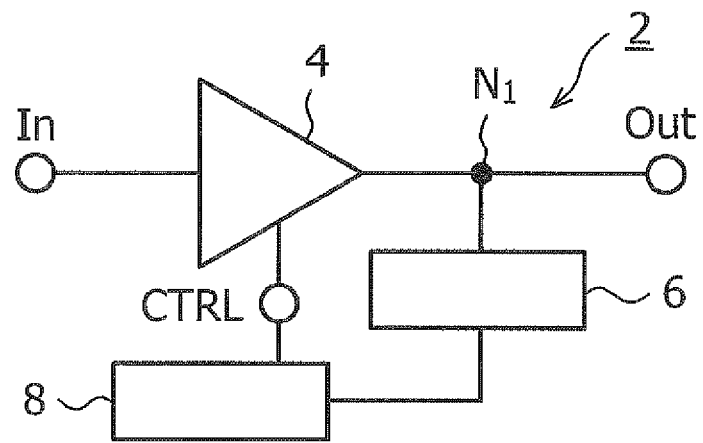
FIG. 1A is a functional block diagram of a circuit with the ALC function.

An electronic circuit 2 implementing with an ALC is first described. FIG. 1A is a functional block diagram of a circuit implementing with the ALC. An amplifier 4 is put between the input and output terminals, In and Out, respectively. A detector 6 is put between the output terminal Out and a controller 8. The output of the controller 8 is guided to a control terminal CTRL of the amplifier 4. The amplifier 4 is a type of, what is called, a variable gain amplifier (hereafter denoted as VGA) to amplify an input signal provided in the input terminal In and to provide an amplified signal in the output terminal Out. The detector 6 detects amplitude of the amplified signal. The controller 8 controls the gain of the amplifier 4 such that the amplitude of the output signal detected by the detector 6 becomes constant. The circuit 2 shown in FIG. 1A is applicable as a front end unit of a base station and/or a mobile phone because the output amplitude is kept substantially constant even when input amplitude, or input power, varies, which means that, even the signal power of the electromagnetic wave of the mobile phone varies, the volume control of the mobile phone may be kept unchanged. The amplifier 4 may include a field effect transistor (hereafter denoted as FET) as an active device, and a bias Vcont appearing in the terminal CTRL is supplied to the FET as a gate bias to adjust the gain of the FET.

Figure 1B:
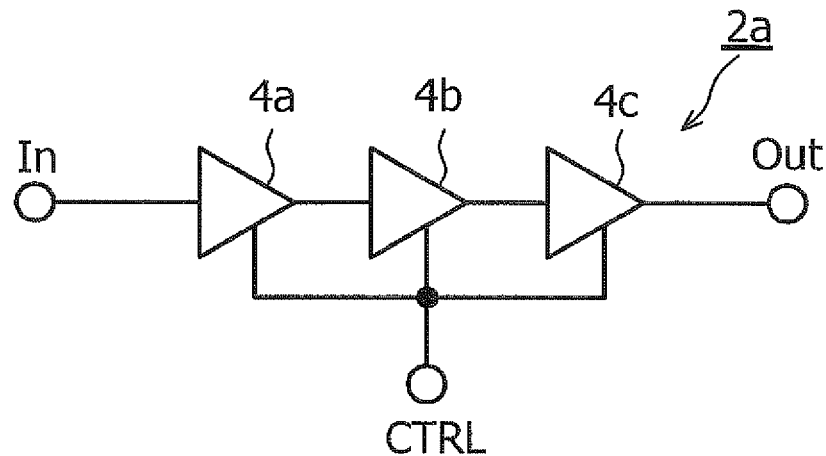
FIG. 1B is another circuit with an arrangement of multiple stages.

FIG. 1B shows another functional block diagram of a circuit 2a that includes three amplifiers, 4a to 4c, each coupled with the common terminal CTRL to adjust the gains of respective amplifiers, 4a to 4c. This type of the circuit is called as a multiple stage amplifier, where three amplifiers, 4a to 4c, are put in series between the input terminal In and the output terminal Out.

Figure 1C:
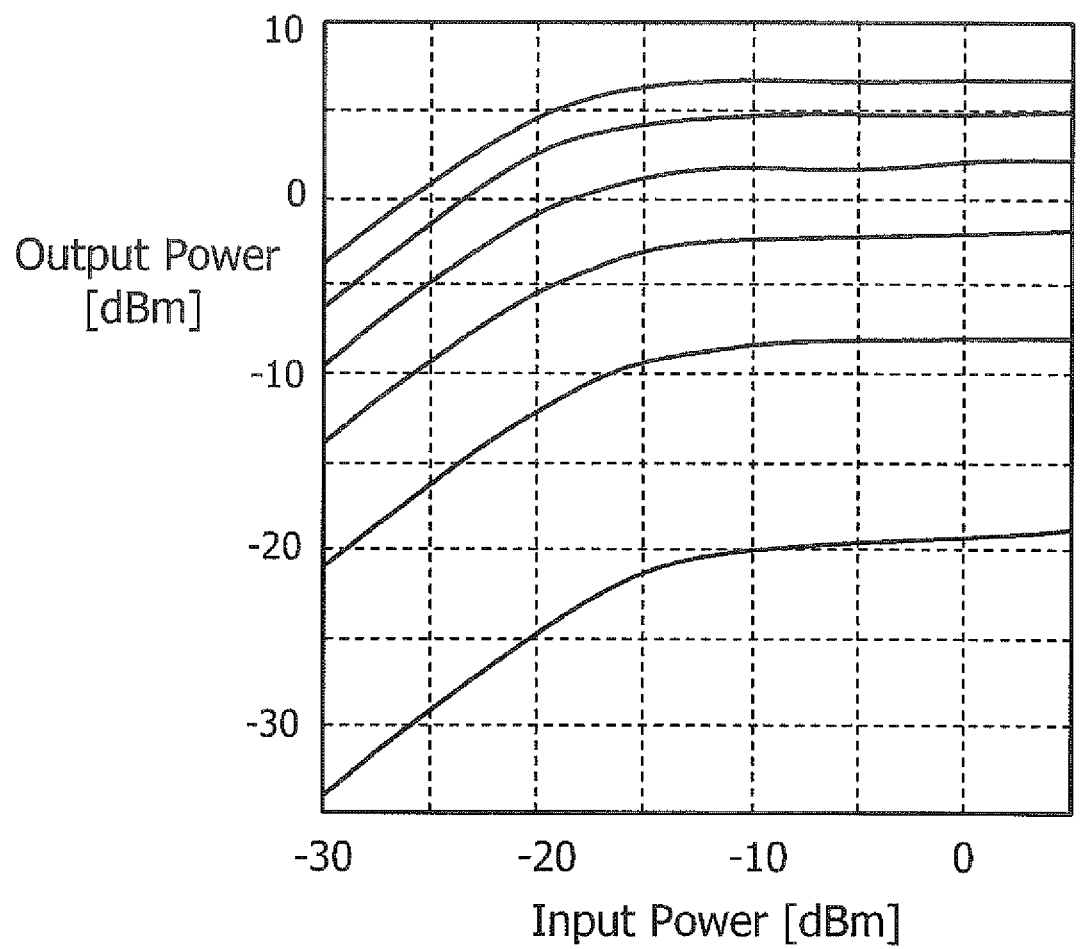
FIG. 1C shows input/output characteristics of a conventional amplifier.

FIG. 1C shows input-output characteristics of the amplifier 4 shown in FIG. 1A as varying the control bias Vcont. The behaviors in FIG. 1C correspond to the biases of 0 to −0.5 V by a step of −0.1 V from the top one to the bottom one. As shown in FIG. 1C, the output power saturates for the input power greater than −10 dBm. Specifically, when the output power is kept constant in, for instance, −8 dBm, the control bias Vcont is necessary to be increased from −0.4 V to −0.2 V for the input power less than −10 dBm to increase the gain of the amplifier 4, but the control bias Vcont is set constant in −0.4 V for the input power greater than −10 dBm. In other words, when the input power increases, the control bias Vcont is necessary to be decreased to reduce the gain of the amplifier 4. However, as shown in FIG. 1C, the saturated output power becomes smaller as the control bias Vcont is reduced, namely, the gain of the amplifier 4 decreases.

FIG. 2A is a block diagram of a circuit 2b implementing with a function of the VGA with the type of, what is called, the opposite phase combining amplifier. The circuit 2b provides a balun 5 connected to the input port In. One of two outputs of the balun 5 is provided to the input of an amplifier 4d, while, the other output is connected to the other amplifier 4e. The output of the former amplifier 4d is guided to one of the inputs of the combiner 7. Also, the output of the latter amplifier 4e is guided to the other input of the combiner 7. The combiner 7 in the output thereof is connected to the output terminal Out. The balun 5, as well known in the field, generates two output signals balanced to each other from an unbalanced input signal. Specifically, the balun 5 generates two signals, Sa and Sb, with a phase difference of 180° from the input signal coming from the input terminal In. The two outputs, Sa and Sb, are provided to respective amplifiers, 4d and 4e. The combiner 7 combines two output signals coming from respective amplifiers, 4d and 4e, to generate a combined output signal Sc to the output terminal Out.

FIGS. 2B to 2D show mechanisms of the signal combining. As shown in FIG. 2B, when the signal Sa is far greater than the other input signal Sb, the combined signal Sc becomes slightly smaller than the former signal Sa. When the signal Sb is about half of the other Sa, the combined signals Sc becomes about half of the input single Sa, as shown FIG. 2C. Finally, when two input signals, Sa and Sb, have magnitude comparable to each other, the combined signal Sc becomes a faint signal, or disappears. Thus, when the outputs of respective amplifiers, 4d and 4e, saturate in a low level, two signals, Sa and Sb, having comparable amplitudes are combined and the output Sc becomes small.

(First Embodiment)

The first embodiment relates to a circuit to adjust amplitude of a signal by a phase shifter. FIG. 3A shows a functional block diagram of a circuit 100 according to the first embodiment. The attenuator 3a in the circuit 100 includes a phase shifter 10a, a divider 12, and a combiner 16.

The attenuator 3a couples with the input terminal in the input of the divider 12. One of two outputs of the divider 12 is directly connected to the combiner 16, while, the other output of the divider 12 is indirectly connected thereto through the phase shifter 10a. The phase shifter 10a in the output thereof is connected to the combiner 16. The output of the combiner 16 is coupled with the input of the amplifier 4. The output of the amplifier 4 is provided to the output Out of the circuit 100.

The divider 12 generates two outputs, S1 and S2, where they have respective magnitudes comparable to each other and phases substantially same with the other, namely, a phase difference between two outputs is substantially zero. The phase shifter 10a generates a signal S3 provided to the combiner 16 by shifting the phase of the signal S2. The combiner 16 takes a vector sum of two signals, S1 and S3, to generate a signal S4 to the amplifier 4. The amplifier 4 amplifies the signal S4.

FIGS. 3B to 3D schematically explain mechanisms to add two signals, S1 and S3. As described, two signals, S1 and S3, have magnitudes substantially same to the other and phases different by θ.

FIG. 3B shows the mechanism to add two signals having a phase difference θ of 20°. In such a case, the signal S4 generated by the combiner 16 has the magnitude greater than that of the signals, S1 and S3. When the phase difference between two signals, S1 and S3, is 90°, the generated signal S4 in the magnitude thereof is smaller than the magnitude of the case shown in FIG. 3B. When the phase difference between two signals, S1 and S3, becomes larger, for instance, the phase difference is 160°, the generated signal S4 becomes further smaller as shown in FIG. 3D. Not shown in figures, when the phase difference becomes 0°, the generated signal S4 in the magnitude thereof becomes a maximum; while, the phase difference is 180°, the generated signal S4 disappears because two signals, S1 and S3, are fully compensated.

(Second Embodiment)

Figure 4A:
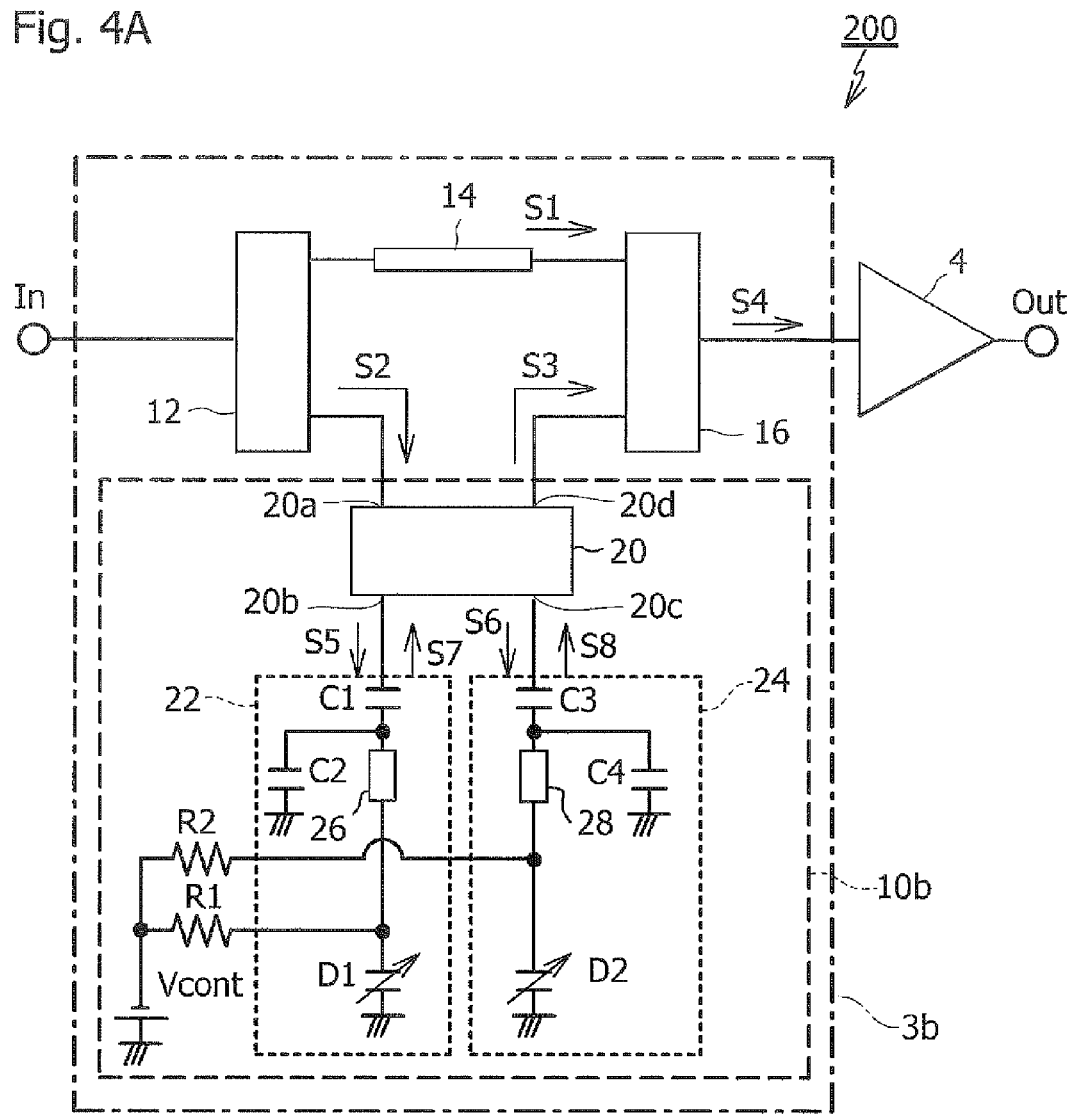
FIG. 4A is a functional block diagram of a circuit implemented with another attenuator having two reflectors and a coupler.

The second embodiment relates to a circuit that implements with a reflective phase shifter for the phase shifter 10a of the first embodiment. FIG. 4A is a circuit diagram of the circuit 200 according to the second embodiment. The circuit 200 includes an attenuator 3b and an amplifier 4. The attenuator 3b includes a phase shifter 10b, the divider 12, a delay line 14, and the combiner 16.

The phase shifter 10b of the second embodiment is, what is called, the reflective phase shifter, and includes a coupler 20, and two reflectors, 22 and 24. The coupler 20, which is the 90° hybrid coupler, provides four ports, 20a to 20d. The first reflector 22 includes two capacitors, C1 and C2, a delay element 26, and a varactor diode D1. The other reflector 24, the second reflector, also includes two capacitors, C3 and C4, a delay element 28 and a varactor diode D2.

The input terminal In also couples with the input of the divider 12. One of two outputs of the divider 12 is coupled with the combiner 16 through the delay element 14. The other output of the divider 12 is coupled with one of ports 20a of the coupler 20. The port 20b is connected to the capacitor C1 of the first reflector 22. The other terminal of the capacitor C1 is grounded through the second capacitor C2 and a series circuit of the delay element 26 and the varactor diode D1. The varactor diode D1 is biased by a reference Vcont through a resistor R1. Rest two ports, 20d and 20c, of the coupler 20 have arrangements similar to the two ports, 20a and 20b, described above. That is, the port 20d is coupled with the combiner 16, while, the port 20c is connected to one of terminals of the third capacitor C3, while, the other terminal of the third capacitor C3 is grounded through the fourth capacitor C4 and a series circuit of the delay element 28; and the other varactor diode D2 biased by the control bias Vcont through the second resistor R2. Thus, two reflectors, 22 and 24, are equivalent to respective ports, 20b and 20c, of the coupler 20.

The last port 20d of the coupler 20 is connected with the combiner 16. The output of the combiner 16 is guided to the amplifier 4, while, the output of the amplifier 4 is connected to the output Out of the circuit 200.

The divider 12, as already described, divides the signal provided from the input terminal In into two signals, S1 and S2. The one of outputs S1 of the divider 12 enters the combiner 16 after passing the delay element 14 to delay the phase thereof. The other output S2 enters the phase shifter 10b that delays the phase of the signal S2 and outputs thus processed signal S3 to the combiner 16. The combiner 16 combines two signals, S1 and S3.

The mechanism to generate the signal S3 by the phase shifter 10b will be described in detail. The coupler 20 divides the signal S2 input to the port 20a into two parts, S5 and S6, to output them from respective ports, 20b and 20c. The signal S5 has a phase same with the phase of the input signal S2; while, the other signal S6 has a phase different by 90° from that of the input signal S2. The first reflector 22 reflects the signal S5 input therein to the signal S7 as varying the phase thereof. The second reflector 24 reflects the signal S6 input therein to the signal S8. Because the reflectors, 22 and 24, wholly reflect the signals, S5 and S6, the reflected signals, S7 and S8, have the magnitude same with those of the input signals, S5 and S6, respectively. The coupler 20 varies the phase of the signal S7 input to the port 20b by 90° but holds the phase of the signal S8 input to the port 20c to generate the signal S3 output from the port 20d by combining two signals, S7 and S8. Thus, the signal S3 inherently has a phase different from that of the signal S1. The delay of the signal S7 from the signal S5 in the reflector 22 is comparable with that of the signal S8 with respect to the signal S6 in the other reflector 24. Two signals, S7 and S8, are combined at the port 20d as the phase same to each other to be output therefrom as the signal S3, while, two signals, S7 and S8, also combined at the port 20a as an opposite phase to be cancelled thereat.

The varactor diodes, D1 and D2, in capacitance thereof may vary the phase of the signals, S7 and S8, with respect to the signals, S5 and S6. Specifically, the bias Vcont applied to the varactor diodes, D1 and D2, may vary the junction capacitance thereof. Accordingly, the bias Vcont may vary the phase of the signal S3 by varying the delays of the signals, S7 and S8, from the signals, S5 and S6. The combiner 16 combines two signals, S1 and S3, to generate the combined signal S4. The amplifier 4 amplifies the combined signal S4. Next, the combination of two signals, S1 and S3, will be described.

Figure 4B:
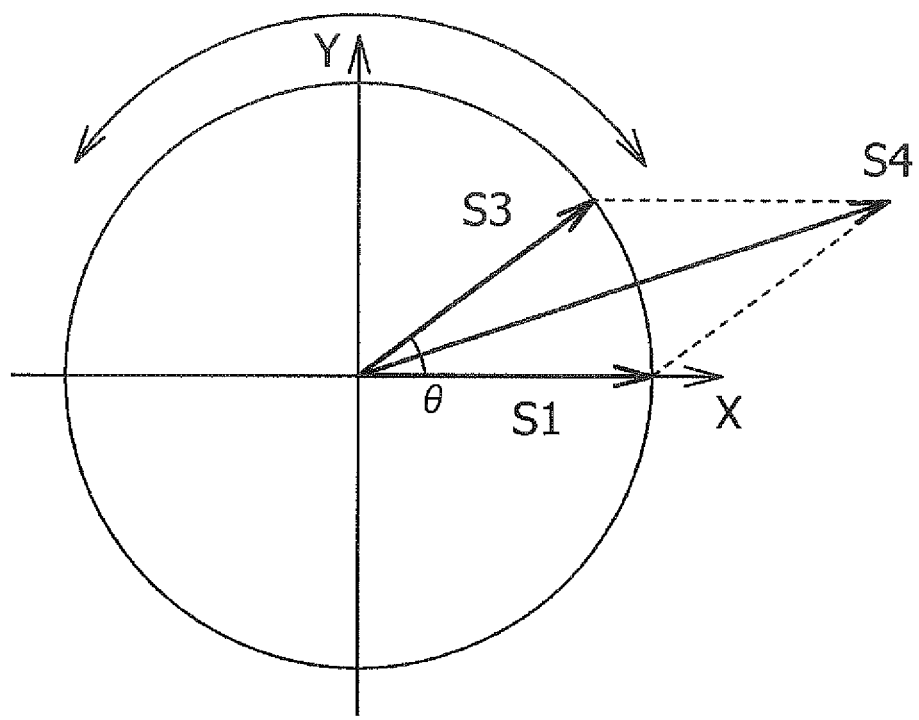
FIG. 4B schematically describes a mechanism to combine two signals to generate a vector sum thereof.

FIG. 4B schematically illustrates a mechanism to combine two signals. Assuming that two signals, S1 and S3, have a phase difference θ, where θ is greater than 0° but less than 180°. The combined signal S4 is obtained as a vector sum of two components, S1 and S3. As shown in FIG. 4B, the magnitude of the signal S4 depends on the phase difference θ. When the phase difference θ is less than 90° as shown in FIG. 4B, the magnitude of the signal S4 becomes greater than that of the signals, S1 and S3. In an extreme at θ=0°, the magnitude of the combined signal S4 becomes maximum, namely, twice of the original signals, S1 and S3. Oppositely, when the phase difference θ is equal to 180°, two signals, S1 and S3, cancel to each other and the combined signal S4 disappear.

Figure 5:
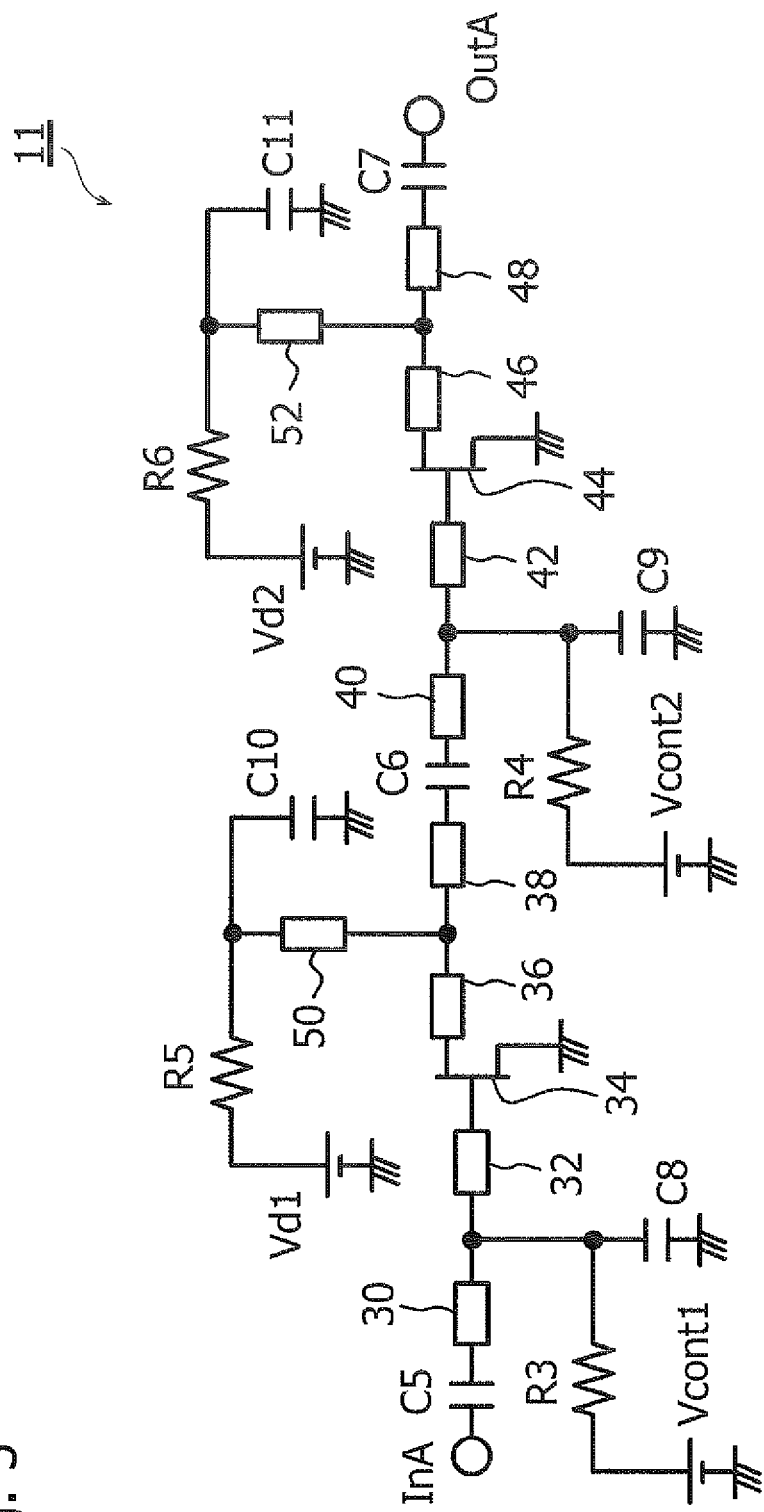
FIG. 5 is a circuit diagram of an exemplary amplifier implemented within the circuits shown in FIGS. 3A and 4A.

FIG. 5 is an exemplary circuit diagram of the amplifier 4. The circuit 11 provides (1), between the input InA and the gate of the FET 34, a series circuit of a capacitor C5 and two transmission lines, 30 and 32, to adjust a phase; (2), between the drain of the first FET 34 and the gate of the second FET 44, a series circuit of two transmission lines, 36 and 38, to adjust a phase, a capacitor C6, and two transmission lines, 40 and 42, to adjust a phase; and (3), between the drain of the second FET 44 and the output OutA, two transmission lines, 46 and 48, to adjust a phase, and a capacitor C7.

A parallel circuit of a capacitor C8 and a resistor R3 is connected between the transmission lines, 30 and 32, where the capacitor C8 is grounded, while, the resistor R3 is grounded through a bias Vcont1 that biases the gate of the first FET 34. Another parallel circuit of a capacitor C9 and a resistor R4 is connected between two transmission lines, 40 and 42, where the capacitor C9 is grounded, while, the resistor R4 is also grounded through another bias Vcont2 that biases the gate of the second FET 44. Still another parallel circuit of a capacitor C10 and a resistor R5 is connected through a transmission line 50 between two transmission lines, 36 and 38. The capacitor C10 is grounded, while, the resistor R5 is grounded through a bias Vd1 that supplies a drain bias to the drain of the first FET 34. Still another parallel circuit of a capacitor C11 and a resistor R6 is connected through a transmission line 52 between two transmission lines, 46 and 48. The capacitor C11 is grounded, while, the resistor R6 is also grounded but through another bias Vd2 that supplies a drain bias to the drain of the second FET 44.

The performance of the circuit 200 shown in FIG. 4A, in particular, the performance of the reflectors, 22 and 24 is evaluated. Assuming the capacitance of the capacitors, C1 and C3, is 10 fF; that of the capacitors, C2 and C4, is 60 fF; an electrical length of the delay lines, 26 and 28, is λ/4, where λ is a wavelength of the signal S2; the resistance of the resistors, R1 and R2, 10 kΩ; the gate biases, Vcont1 and Vcont2, of two FETs, 34 and 44 are −0.06V; the drain biases, Vd1 and Vd2, of two FETs, 34 and 44, are 3 V; a variable range of the capacitance of the varactor diodes, D1 and D2, are 20 to 200 fF; the amplifier 4 includes two units each having the circuit shown in FIG. 5; and the delay line 14 delays the phase of the signal S1 having the frequency of 50 GHz by 146°; then, the phases of the signals, S1 and S3, and the difference therebetween are evaluated as shown in the table 1. Thus, varying the capacitance Cd of the varactor diodes, D1 and D2, an optional phase difference θ between two signals, S1 and S3, may be obtained.

TABLE 1

| Cd [fF] | θ1 [degree] | θ3 [degree] | θ [degree] |
|---|---|---|---|
| 20 | 146 | 324 | 182 |
| 40 | 146 | 413 | 93 |
| 100 | 146 | 513 | −7 |

In table 1, the phases, θ1 and θ3, are those measured from that of the signal input to the input terminal In.

Figure 6A:
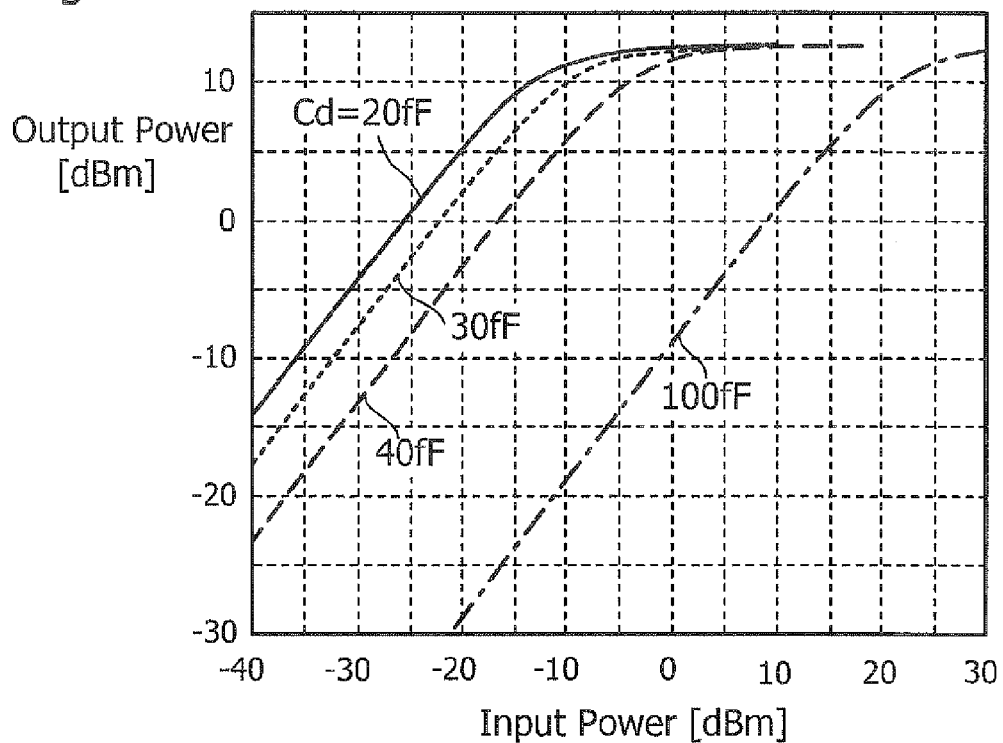
FIG. 6A shows input-output characteristics of the circuit shown in FIG. 4A.
Figure 6B:
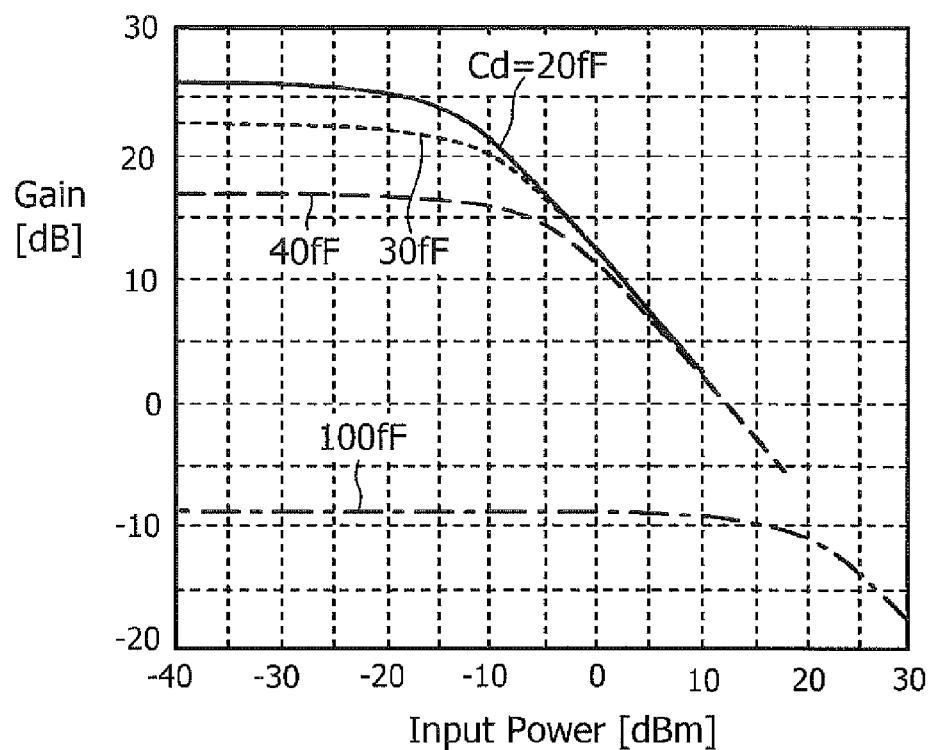
FIG. 6B shows gain characteristics against input power of the circuit shown in FIG. 4A.

FIG. 6A shows output performance of the circuit 200 against the input power as varying the capacitance of the varactor diodes, D1 and D2, from 20 fF to 100 fF. In FIG. 6A, the horizontal axis corresponds to the input power, while, the vertical axis corresponds to the output power. FIG. 6B shows gain characteristics of the circuit 200.

The circuit 200 shows an excellent linearity in a wide range of the input power, as shown in FIG. 6A; while, the circuit may vary the gain by varying the capacitance Cd of the varactor diodes, D1 and D2. Even when the gain is set in small, the saturation output power may be substantially kept constant in around 12.5 dBm.

In the second embodiment, the reflector generates the signal S3 with a phase different from that of the signal S1 by 0 to 180°; the combiner 16 combines the signal S3 with the signal S1 to generate the signal S4; and the amplifier 4 amplifies the signal S4 to output from the output terminal Out. Thus, the function of the ALC may be realized. When the phase shifter includes active devices such as transistors, the saturation of the output from the transistor degrades the linearity of the attenuating circuit. In the present embodiment, the phase shifter 10b includes only capacitors, resistors, and varactor diodes without providing any active devices, which prevents the phase shifter 10b from saturating the output power thereof. Accordingly, the circuit 200, as shown in FIG. 6A, shows an excellent linearity.

The phase difference between the signal S3 and the signal S1 may vary from 0 to 180° as shown in FIG. 4B, the combined signal S4 varies the magnitude thereof from 0 to twice of that of the signal S1. The phase difference between two signals, S1 and S3, may be accomplished by the bias Vcont applied to the varactor diodes, D1 and D2.

The reflector 22 preferably shows the phase characteristic comparable with that of the other reflector 24 in order to cancel two signals, S7 and S8, at the port 20a but enhance them at the port 20d. Accordingly, two reflectors, 22 and 24, preferably comprise the arrangement same to each other, and respective varactor diodes, D1 and D2, have the capacitance same to each other. The phase difference between two signals, S7 and S8, is preferably to be 90° to cancel/enhance at the ports, 20a and 20d, respectively. However, some tolerance in the phase difference may be allowable; for instance, the phase difference of 90±10°, 90±20°, and so on, may be compensated by the coupler 20. The phase shifter 10b in the arrangement thereof is not restricted to those shown in FIG. 4A; for instance, the capacitors, C1 to C4, may be replaced to varactor diodes, and/or the delay elements, 26 and 28, may be respective inductors.

(Third Embodiment)

Figure 7:
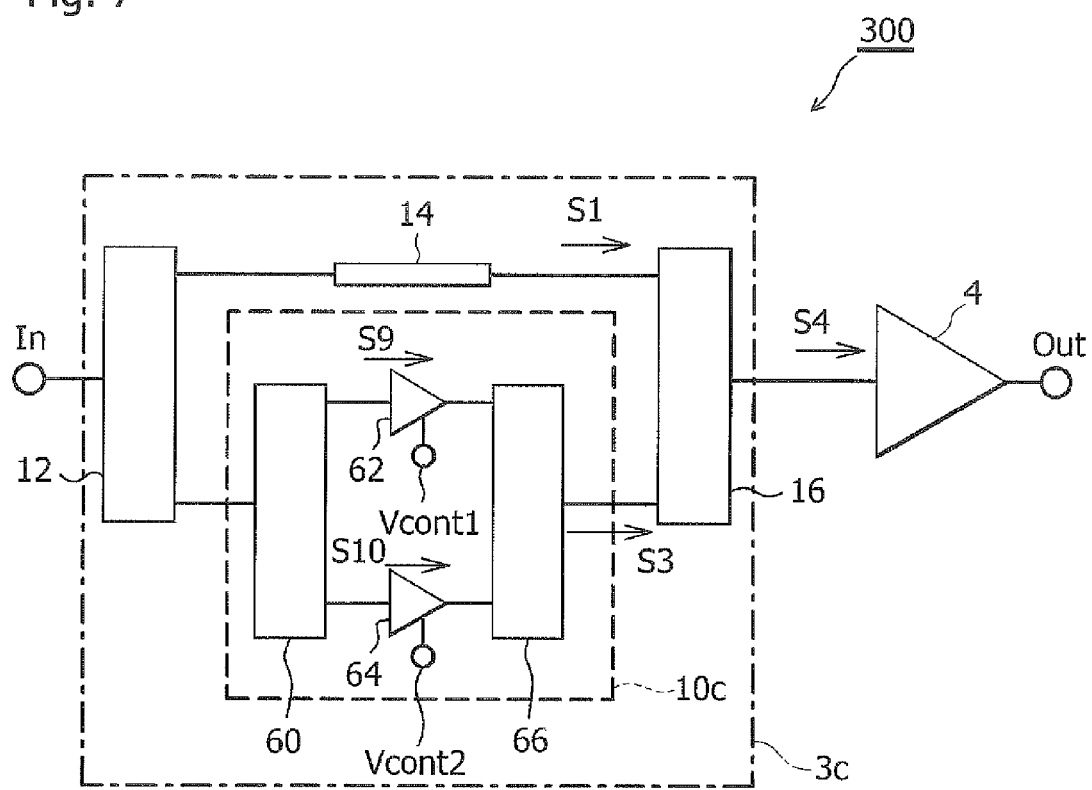
FIG. 7 is a functional block diagram of another circuit implemented with an attenuator implemented with a phase shifter of a type of the vector sum.

The third embodiment of the present application implements a phase shifter of a type of the vector sum. FIG. 7 is a functional block diagram of the circuit 300 of the third embodiment.

The circuit 300 includes an attenuator 3c and an amplifier 4. The attenuator 3c includes a phase shifter 10c with a type of a vector combiner. The phase shifter 10c includes a divider 60, two amplifiers, 62 and 64, and a combiner 66. The divider 12, as that of the aforementioned embodiment, has two outputs, one of which is connected to the delay element 14, while, the other is connected to the input of the second divider 60. Two outputs of the second divider 60 are provided to respective amplifiers, 62 and 64; and respective outputs of the amplifiers, 62 and 64, are combined by the second combiner 66. The output of the second combiner 66 is provided to the first combiner 16 and combined with the output of the delay element 14.

The first divider 60 divides the input thereof into two outputs with a phase difference therebetween by 90°. That is, the first amplifier 62 transfers the signal S9 from the output of the second divider 60 to the second combiner 66, while, the second amplifier 64 transfers the signal S10, whose phase is different by 90° from that of the signal S9, from the other output of the second divider 60 to the second combiner 66. The second combiner 66 combines two signals, S9 and S10, each transferred from respective amplifiers, 62 and 64, without varying the phases thereof to generate the signal S3. Two amplifiers, 62 and 64, may be a type of the variable gain amplifier whose gain is adjustable by respective control signals, cont1 and cont2.

Figure 8A:
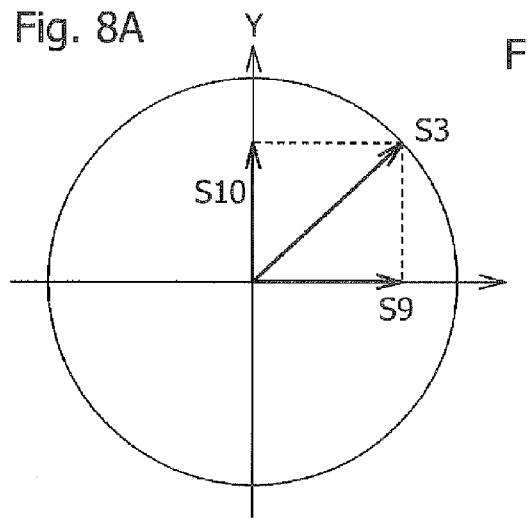
FIGS. 8A to 8C show mechanism to obtain a vector sum of two signals by two variable gain amplifiers.
Figure 8B:
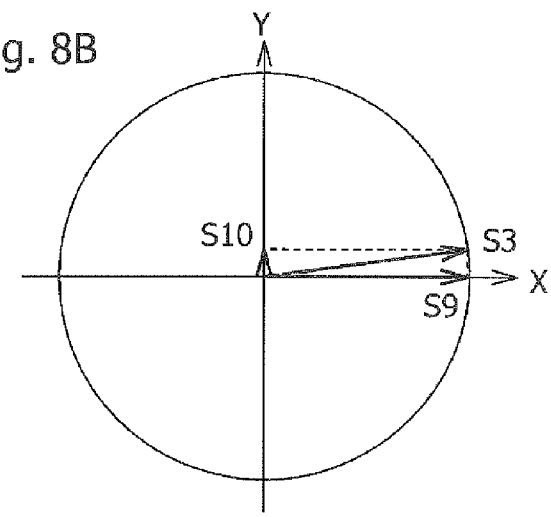
Figure 8C:
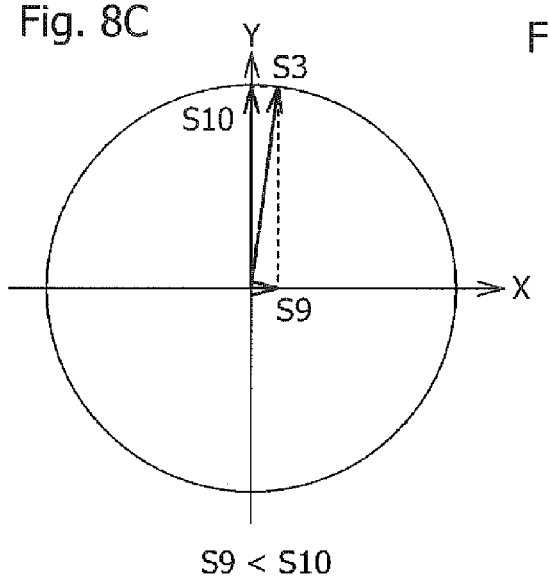

FIGS. 8A to 8C schematically illustrate the mechanism to generate the signal S3 by combining two signals, S9 and S10. As described, the signals, S9 and S10, have the phase difference of 90° but the magnitudes thereof are variable by the control signals, Vcont1 and Vcont2. When two amplifies, 62 and 64, have the gains thereof equal to each other, the combined signal S3 has the phase difference by 45° from that of the signal S9, as shown in FIG. 8A. When the gain of the second amplifier 64 is less than that of the first amplifier 62, the combined signal S3 has the phase difference less than 45° from that of the signal S9, shown in FIG. 8B. When the second amplifier 64 has the gain greater than that of the first amplifier 62, the combined signal S3 has the phase difference greater than 45° with respect to that of the signal S9, as shown in FIG. 8C. Thus, the phase difference of the combined signal S3 measured from the signal S9 may be varied from 0 to 90°.

Figure 8D:
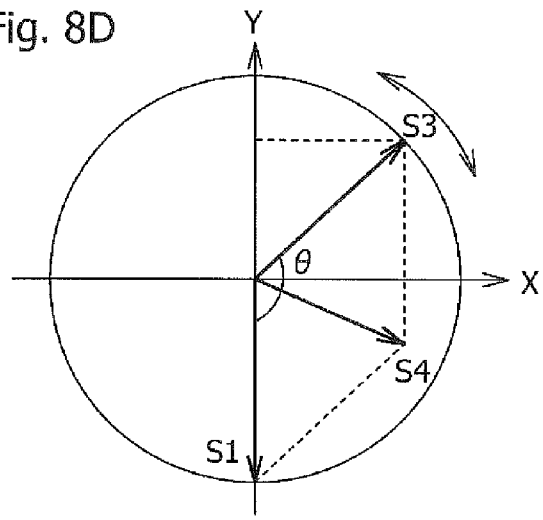
FIG. 8D also shows a mechanism to generate vector sum of two signals one of which is generated by an output of the combiner for two outputs of the variable gain amplifiers.

FIG. 8D schematically illustrates the mechanism to combine two signals, S1 and S3, for generating the signal S4. Assuming the phase of the signal S1 in the −Y direction; the combined signal S4 is generated by the vector sum of two signals, S1 and S3, as shown in FIG. 8D. When the signal S3 may be taken along the +X direction, which means that the contribution of the second signal S10 disappears, the magnitude of the combined signal S4 becomes maximum. On the other hand, when the signal S3 is taken along +Y direction, which means that the first amplifier 62 in the gain thereof is set to be zero, two signals, S1 and S3, completely cancel to generate no signal S4. Thus, the signal S3 in the phase thereof against the phase of the signal S9 may be varied by setting the gains of respective amplifiers, 62 and 64, and the combined signal S4 may be varied in the amplitude thereof.

The performance of the circuit 300 is evaluated. In the evaluation, the amplifier 4 has the arrangement of the two-stage amplifier each consisted by a unit 11 shown in FIG. 5. The amplifiers, 62 and 64, also have the arrangement 11 shown in FIG. 5; and the gains thereof may be varied by adjusting the gate biases, Vcont1 and Vcont2. The power supply, Vd1 and Vd2, of the amplifiers, 4, 62, and 64, are set to be 3 V. The delay line 14 delays the phase of the signal S1 having a frequency of 50 GHz by 795° measured from the signal provided in the input terminal In.

The table 2 below listed shows the phase of the signals, S1 and S3, measured from the signal provided in the input terminal In and the difference between them against the gain of two amplifiers, 62 and 64.

TABLE 2

| Vcont1 [V] | Vcont2 [V] | θ1 [degree] | θ3 [degree] | θ [degree] |
| --- | --- | --- | --- | --- |
| −0.06 | −0.70 | −83 | 181 | −96 |
| −0.16 | −0.16 | −83 | 124 | −153 |
| −0.70 | −0.06 | −83 | 93 | −184 |

When two control signals, Vcont1 and Vcont2, are set to be −0.06V and −0.70V, respectively, which means that the first amplifier 62 has a gain greater than that of the second amplifier 64 and corresponds to the case shown in FIG. 8B, the combined signal shows a phase difference 83 of 181° with respect to the signal provided in the port In. That is, the signal in the terminal In has the phase almost along the −X direction.

When two control signals, Vcont1 and Vcont2, are comparable in −0.16V, which corresponds to the case shown in FIG. 8A; the combined signal S3 shows the phase θ3 of 124° measured from the signal in the terminal In, namely, almost along the −X direction. Finally, when the second control signal Vcont2 is set to be −0.06 V but the first one is −0.7 V; the phase θ3 of the signal S3 measured from the input signal, namely almost along the −X direction, becomes 93° as shown in FIG. 8C. In three cases described above, the phase θ1 of the signal after transmitting in the delay line 14 is kept constant in −83° almost along −Y direction as shown in FIG. 8D. Thus, the combined signal S4 may be varied in the magnitude thereof depending on the control signals, Vcont1 and Vcont2.

Figure 9A:
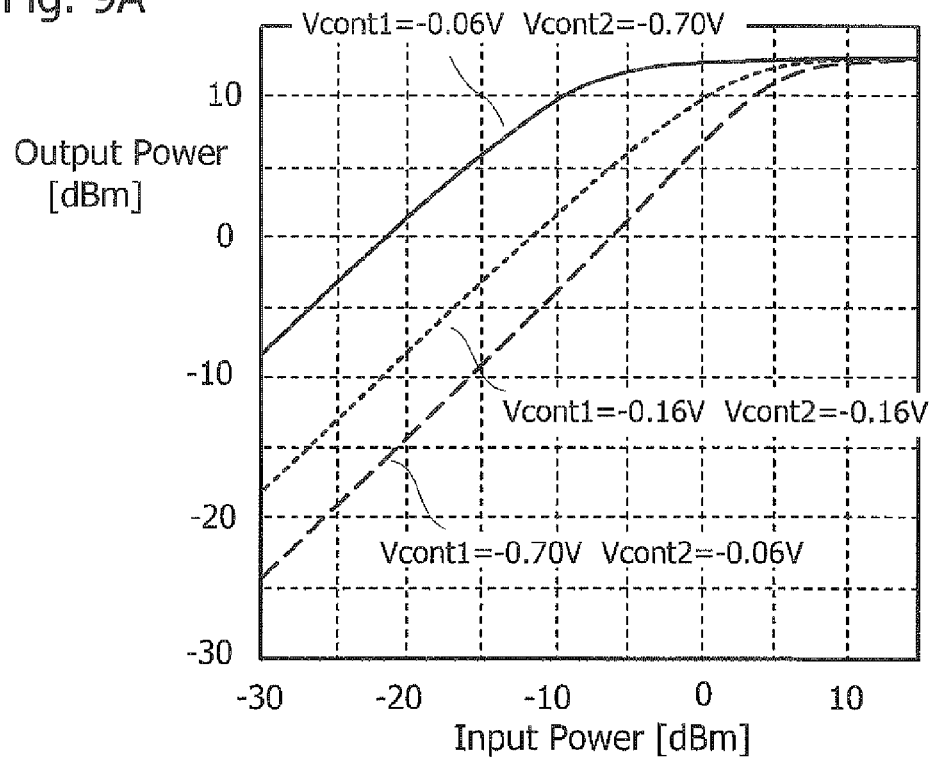
FIG. 9A is output-input characteristics of the circuit shown in FIG. 7 as varying the gains of two amplifiers.
Figure 9B:
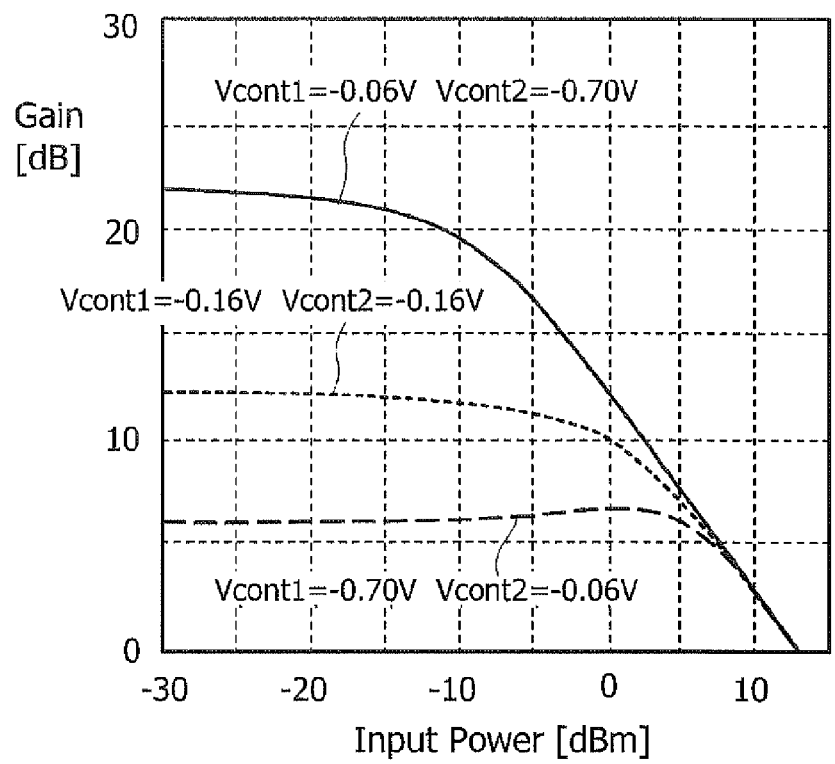
FIG. 9B is gain characteristics of the amplifier shown in FIG. 7 against input power.

FIG. 9A shows the output power against the input power of the circuit 300 as varying the gains of the amplifiers, 62 and 64, by adjusting the control signals, Vcont1 and Vcont2, while, FIG. 9B shows the gain against the input power of the circuit 300. The circuit 300 shows an excellent linearity in a wide range of the input power. Moreover, even when the gain of the circuit 300 reduces, the saturation in the output power is substantially invariant to be kept around 12.5 dBm. Selecting two control signals, Vcont1 and Vcont2, the signal S4 output from the output terminal Out may be adjusted in the magnitude thereof. Accordingly, the ALC function may be realized.

FIGS. 9A and 9B show performance of the circuit 300, where FIG. 9A shows the input-output performance, while, FIG. 9B shows the gain characteristics of the circuit 300 as varying the control signals, Vcont1 and Vcont2.

The circuit 300 shows a superior linearity in a wide range of the input power. Moreover, even when the gain thereof is decreased, the saturated output power may be substantially kept constant. Accordingly, when the gain is reduced for large input power, the reduction of the output power is suppressed. Two control signals, Vcont1 and Vcont2, may vary the magnitude of the output signal similar to that shown in FIG. 4B, which means that the circuit 300 is applicable in the ALC.

The phase shifter 10c with the type of the vector sum may generate the signal S3 having a phase of 90 to 180° measured from that of the signal S1; and the ALC is available by combining two signals, S1 and S3, and amplifying the combined signal S4. The phase shifter 10c provides two amplifiers, 62 and 64. Even when one of amplifiers, 62 and 64, saturates or outputs substantially no signal, rest of the amplifiers may linearly operable, which may enhance the linearity of the circuit 300.

In the embodiment shown in FIG. 7, the second divider 60 sets the phase difference of 90° between two output signals, S9 and S10. However, the second divider 60 sets the phase difference of 0° between them; but the second combiner 66 may combine two signals, S9 and S10, as setting the phase difference of 90° therebetween. That is, one of the second divider 60 and the second combiner 66 sets the phase difference of 90° between two signals, S9 and S10. As already described, the phase difference between two signals, S9 and S10, is unnecessary to be exactly 90°. Some tolerances of 90±10°, 90±20°, or else may be allowable for the circuit 300.

Moreover, the circuit 300 may be fanned in compact by integrating three amplifiers, 4, 62, and 64, on a common substrate. Although the description above concentrates on an arrangement where respective amplifiers, 62 and 64, are varied in the gains thereof; the phase of the combined signal S3 may be varied by adjusting the gain of at least one of the amplifiers, 62 and 64. The transistors implemented within the amplifiers, 4, 62, and 64, may have arrangements same with each other.

Figure 10:
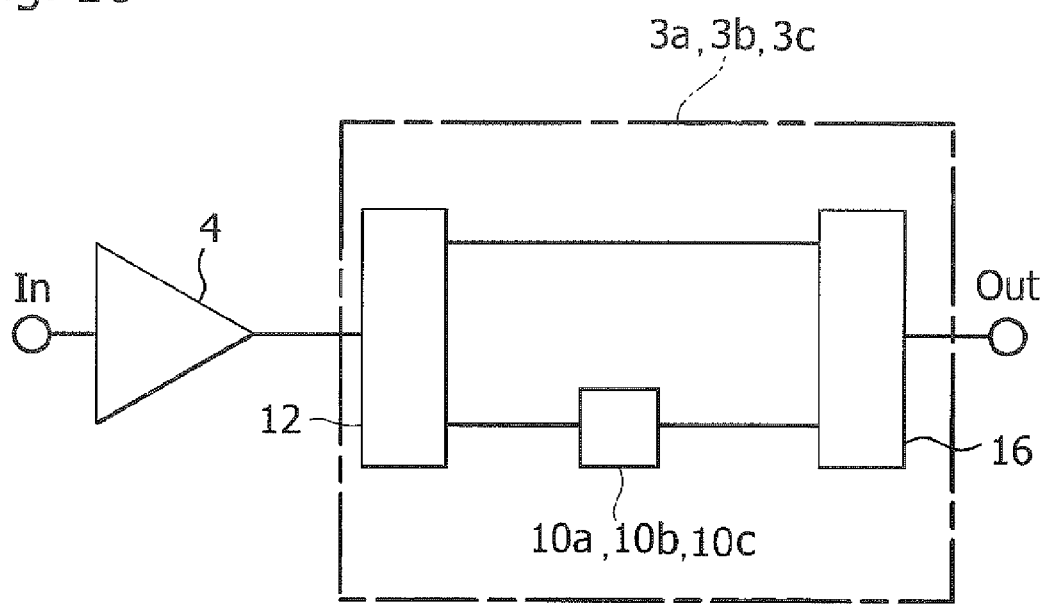
FIG. 10 is a functional block diagram of a circuit implemented with an attenuator according to one example of the present application.

In the aforementioned embodiments, the attenuator is provided in the upstream of the amplifier 4. However, the attenuator may be set in the downstream of the amplifier 4. When the circuits, 100 to 300, are applied to a transmitter, the attenuator is often set in the upstream of the amplifier 4 that operates as a power amplifier. While, when the circuits, 100 to 300, is applied to a receiver, the attenuator is set in the downstream of the amplifier 4 that operates as a low-noise amplifier set in the front end stage, as shown in FIG. 10. The attenuator may be effectively operable as the ALC.

Transistors, 34 and 44, implemented within the amplifier 4 may be made of arsenide semiconductor material and/or nitride semiconductor material. For instance, the former material is gallium arsenide (GaAs), indium gallium arsenide (InGaAs) and so on, while, the latter material is gallium nitride (GaN), aluminum gallium nitride (AlGaN), indium nitride (InN), aluminum indium gallium nitride (AlInGaN), and so on. The transistors, 34 and 44, may be a type of the field effect transistor (FET), bipolar transistor, and so on.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An attenuator comprising:
   a divider configured to divide an input signal into a first signal and a second signal;
   a phase shifter configured to generate a third signal by adjusting a phase of the second signal; and
   a combiner configured to generate a fourth signal by combining the first signal with the third signal, and
   wherein the phase shifter includes,
      another divider configured to receive the second signal,
      a first amplifier configured to receive one of outputs of the another divider,
      a second amplifier configured to receive another of the outputs of the another divider, and
      another combiner configured to receive the output of the first amplifier and the output of the second amplifier to generate the third signal,
   wherein the phase shifter adjusts the phase of the third signal by varying at least one of an amplitude of the first amplifier and an amplitude of the second amplifier.

2. The attenuator of claim 1, wherein at least one of the another divider and the another combiner causes a phase difference between two output signals thereof.

3. The attenuator of claim 1, wherein the phase shifter causes the phase difference of 90 to 180° between the first signal and the third signal.

4. The attenuator of claim 1, further comprising an amplifier set in a downstream of the combiner to amplify the third signal.

5. The attenuator of claim 1, further comprising an amplifier set in an upstream of the divider.

6. The attenuator of claim 1, further comprising a delay element put between the divider and the combiner to delay the first signal.

* * * * *